United States Patent
Lee et al.

(10) Patent No.: US 12,406,744 B2
(45) Date of Patent: Sep. 2, 2025

(54) MEMORY CONTROLLER, STORAGE DEVICE, AND OPERATING METHOD OF STORAGE DEVICE

(71) Applicant: SK hynix Inc., Gyeonggi-do (KR)

(72) Inventors: Taek Gyu Lee, Gyeonggi-do (KR); Byung Jun Kim, Gyeonggi-do (KR); Hui Won Lee, Gyeonggi-do (KR); Kyoung Ku Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 19 days.

(21) Appl. No.: 18/506,184

(22) Filed: Nov. 10, 2023

(65) Prior Publication Data
US 2024/0395347 A1 Nov. 28, 2024

(30) Foreign Application Priority Data
May 24, 2023 (KR) .................... 10-2023-0066801

(51) Int. Cl.
*G11C 29/12* (2006.01)
(52) U.S. Cl.
CPC .................................. *G11C 29/12* (2013.01)
(58) Field of Classification Search
None
See application file for complete search history.

(56) References Cited

U.S. PATENT DOCUMENTS

| | | | | |
|---|---|---|---|---|
| 10,447,767 | B2 * | 10/2019 | Baptist | H04L 67/51 |
| 2003/0099139 | A1 * | 5/2003 | Abrosimov | G11C 29/56 |
| | | | | 365/200 |
| 2007/0067684 | A1 * | 3/2007 | Stolero | G06F 11/267 |
| | | | | 714/E11.16 |
| 2020/0116783 | A1 * | 4/2020 | Kalva | G06F 13/1668 |
| 2023/0289270 | A1 * | 9/2023 | Caraccio | G06F 11/2221 |

FOREIGN PATENT DOCUMENTS

| | | |
|---|---|---|
| KR | 20160143940 A | 12/2016 |
| KR | 20220039562 A | 3/2022 |

* cited by examiner

*Primary Examiner* — Daniel F. McMahon
(74) *Attorney, Agent, or Firm* — IP&T GROUP LLP

(57) ABSTRACT

A memory controller performs a self-test operation on a memory device in response to a diagnostic command received from a host. The controller includes a host interface that receives the diagnostic command and a processor that executes the self-test and generates a corresponding response. The response transmitted to the host includes a basic header segment used in standard protocol communication and an extra header segment that carries result information indicating the outcome of the self-test. This structure enables efficient diagnostic communication between the host and the memory controller without disrupting regular memory operations.

20 Claims, 11 Drawing Sheets

FIG. 5

| Basic Header Segment (61) ||||
|---|---|---|---|
| Transaction Type | Flags | LUN | Task Tag |
| Initiator ID / Command Set Type | Query Function, Task Manag. Function | Response | Status |
| Total EHS Length | Device Information | Data Segment Length ||

FIG. 6

| Command Descriptor Block |||||||||
|---|---|---|---|---|---|---|---|---|
| | | Bit ||||||||
| | | 7 | 6 | 5 | 4 | 3 | 2 | 1 | 0 |
| Byte | 0 | OPERATION CODE ||||||||
| | 1 | Miscellaneous CDB information ||||||||
| | 2 | |||||||
| | 3 | |||||||
| | 4 | |||||||
| | 5 | CONTROL ||||||||

| Command PIU ||||
|---|---|---|---|
| 0 Transaction Type (= xx00 0001b) | 1 Flags | 2 LUN | 3 Task Tag |
| 4 IID \| Command Set Type | 5 Reserved | 6 Reserved | 7 EXT-IID \| Reserved |
| 8 Total EHS Length = zero | 9 Reserved | 10 (MSB) Data Segment | 11 (LSB) Length (0000h) |
| 12 (MSB) | 13 Expected Data | 14 Transfer Length | 15 (LSB) |
| 16 CDB[0] | 17 CDB[1] | 18 CDB[2] | 19 CDB[3] |
| 20 CDB[4] | 21 CDB[5] | 22 CDB[6] | 23 CDB[7] |
| 24 CDB[8] | 25 CDB[9] | 26 CDB[10] | 27 CDB[11] |
| 28 CDB[12] | 29 CDB[13] | 30 CDB[14] | 31 CDB[15] |

FIG. 9

| | | \multicolumn{8}{c|}{SEND DIAGNOSTIC Command Descriptor Block} |
|---|---|---|---|---|---|---|---|---|---|
| | | \multicolumn{8}{c|}{Bit} |
| | | 7 | 6 | 5 | 4 | 3 | 2 | 1 | 0 |
| Byte | 0 | \multicolumn{8}{c|}{OPERATION CODE (1Dh)} |
| | 1 | \multicolumn{3}{c|}{SELF-TEST CODE} | PF | Reserved =0b | SELFTEST | DEVOFFL | UNITOFFL |
| | 2 | \multicolumn{8}{c|}{Reserved} |
| | 3 | (MSB) | \multicolumn{7}{c|}{PARAMETER LIST LENGTH} |
| | 4 | \multicolumn{8}{c|}{(LSB)} |
| | 5 | \multicolumn{8}{c|}{CONTROL = 00h} |

FIG. 10

| | SELF-TEST CODE field | PF bit | SELFTEST bit | PARAMETER LIST LENGTH field |
|---|---|---|---|---|
| Case 1 | 0 | 0 | 0 | 0 |
| Case 2 | 0 | 0 | 0 | !=0 |
| Case 3 | 0 | 0 | 1 | 0 |
| Case 4 | 0 | 0 | 1 | !=0 |
| Case 5 | 0 | 1 | 0 | 0 |
| Case 6 | 0 | 1 | 0 | !=0 |
| Case 7 | 0 | 1 | 1 | n/a |
| Case 8 | !=0 | 0 | 0 | 0 |
| Case 9 | !=0 | 0 | 0 | !=0 |
| Case 10 | !=0 | 0 | 1 | n/a |
| Case 11 | !=0 | 1 | 0 | 0 |
| Case 12 | !=0 | 1 | 0 | !=0 |
| Case 13 | !=0 | 1 | 1 | n/a |

FIG. 11

| | | | | |
|---|---|---|---|---|
| | colspan="4" | Response PIU | | |
| 61 | 0 Transaction Type (= xx10 0001b) | 1 Flags | 2 LUN | 3 Task Tag |
| | 4 IID \| Command Set Type | 5 EXT-IID \| Reserved | 6 Response | 7 Status |
| | 8 Total EHS Length = non-zero | 9 Device Information | 10 (MSB) Data Segment Length | 11 (LSB) |
| 62 | 12 (MSB) | 13 Residual Transfer Count | 14 | 15 (LSB) |
| | 16 | 17 Reserved | 18 | 19 |
| | 20 | 21 Reserved | 22 | 23 |
| | 24 | 25 Reserved | 26 | 27 |
| | 28 | 29 Reserved | 30 | 31 |
| 64 (optional) | k (MSB) Sense Data Length | k+1 (LSB) | k+2 Sense Data[0] | k+3 Sense Data[1] |
| | ... | ... | ... | ... |
| | k+16 Sense Data[14] | k+17 Sense Data[15] | k+18 Sense Data[16] | k+19 Sense Data[17] |
| 63 | m | m+1 Extra Header Segment (EHS) 1 | m+2 | m+3 |
| | n | n+1 Extra Header Segment (EHS) N | n+2 | n+3 |

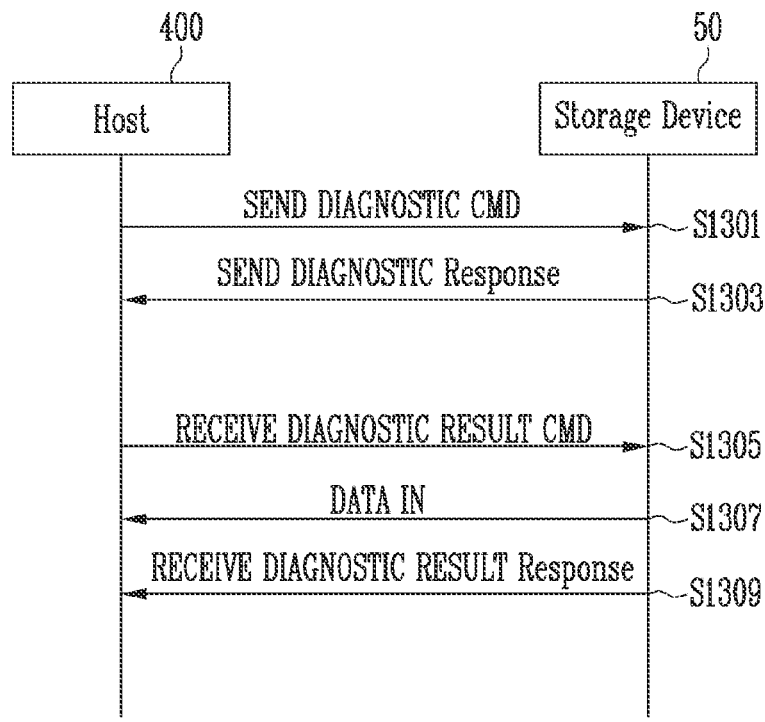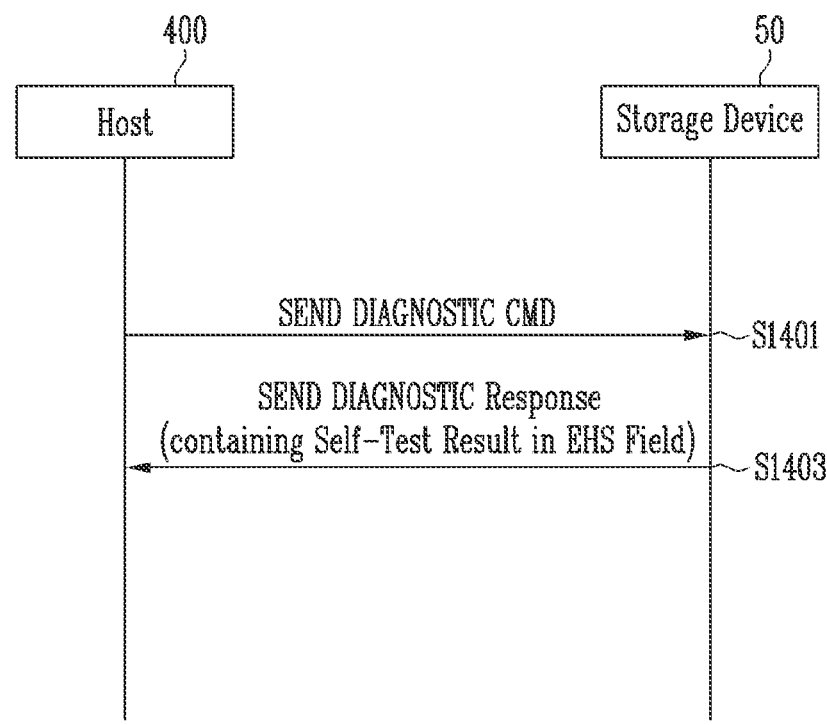

MEMORY CONTROLLER, STORAGE DEVICE, AND OPERATING METHOD OF STORAGE DEVICE

CROSS-REFERENCE TO RELATED APPLICATION

The present application claims priority under 35 U.S.C. § 119 (a) to Korean patent application number 10-2023-0066801 filed on May 24, 2023, the entire disclosure of which is incorporated by reference herein.

BACKGROUND

1. Technical Field

Embodiments of the present disclosure generally relate to an electronic device, and more particularly, to a memory controller, a storage device, and an operating method of a storage device.

2. Related Art

A storage system includes a host and a storage device. The storage device may include a memory controller and a memory device. The storage device may also be implemented only with a memory device. The host and the storage device in the storage system are connected to each other through at least one of various interface standards or protocols, such as a universal flash storage (UFS), a serial ATA (SATA), a small computer system interface (SCSI), a serial attached SCSI (SAS), an embedded MMC (eMMC), and nonvolatile memory express (NVMe).

SUMMARY

Embodiments of the present disclosure provide a memory controller, a storage device, and an operating method of a storage device, capable of efficiently performing a self-test operation.

In accordance with one aspect of the present disclosure, there is provided a memory controller including: a host interface configured to receive, from a host, a diagnostic command for requesting performance of a self-test operation; and a processor configured to perform the self-test operation on a memory device, and generate a response corresponding to the diagnostic command, wherein the host interface is configured to transmit, to the host, the response including: a basic header segment commonly included in protocol information units transmitted/received between the memory controller and the host; and an extra header segment including result information indicating a result of the self-test operation.

In accordance with another aspect of the present disclosure, there is provided a storage device including: a memory device configured to store data; and a memory controller configured to receive, from an outside, a diagnostic command for requesting performance of a self-test operation, perform the self-test operation in response to the diagnostic command, and provide the outside with a response corresponding to the diagnostic command, wherein the response includes: a basic header segment commonly included in protocol information units transmitted/received between the outside and the memory controller; and an extra header segment including result information indicating a result of the self-test operation.

In accordance with still another aspect of the present disclosure, there is provided a method of operating a storage device, the method including: receiving, from an outside, a diagnostic command for requesting performance a self-test operation; performing the self-test operation in response to the diagnostic command; and generating a response including result information on the self-test operation, wherein the response includes: a basic header segment commonly included in protocol information units transmitted/received between the storage device and the outside; and an extra header segment including result information indicating a result of the self-test operation.

BRIEF DESCRIPTION OF THE DRAWINGS

Embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a diagram illustrating a structure of a basic header segment of a Protocol Information Unit (PIU).

FIG. 6 is a diagram illustrating a structure of a command descriptor block included in a transaction specific field of the PIU.

FIG. 9 is a diagram illustrating a structure of a command descriptor block included in a transaction specific field of the diagnostic command in accordance with an embodiment of the present disclosure.

FIG. 10 is a table illustrating a self-test operation according to information included in a transaction specific field of the diagnostic command in accordance with an embodiment of the present disclosure.

FIG. 11 is a diagram illustrating a PIU structure of a response to the diagnostic command in accordance with an embodiment of the present disclosure.

FIG. 13 is a sequence diagram illustrating an operating method of the storage device in accordance with a comparative example of the present disclosure.

FIG. 14 is a sequence diagram illustrating an operating method of the storage device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
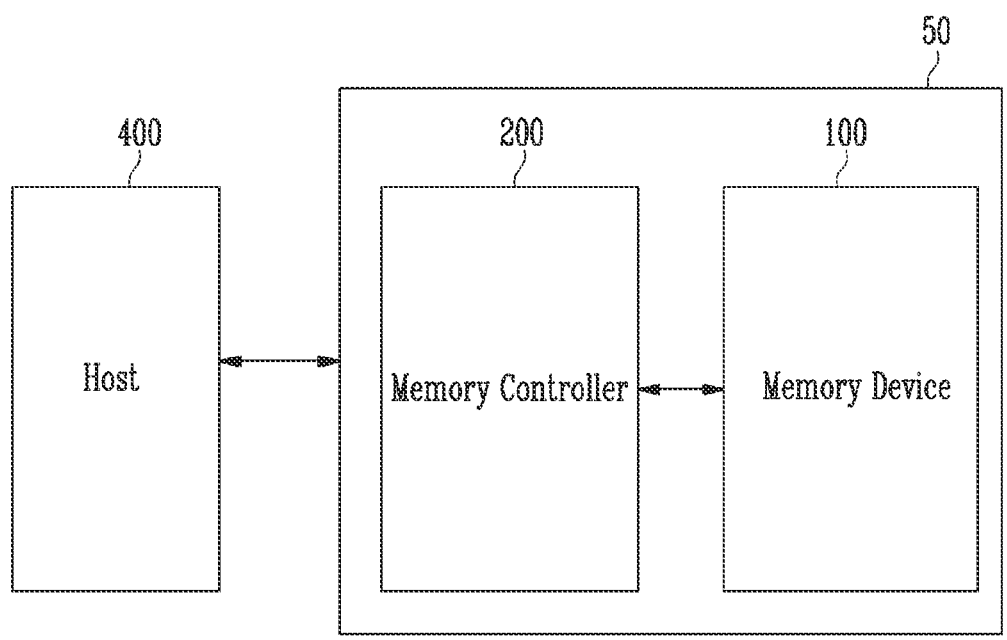
FIG. 1 is a diagram illustrating a storage system in accordance with an embodiment of the present disclosure.

FIG. 1 is a diagram illustrating a storage system in accordance with an embodiment of the present disclosure.

Referring to FIG. 1, the storage system may include a host (i.e., an external device) 400 and the storage device 50. The storage device 50 may include a memory device 100 and a memory controller 200. The storage device 50 may be a device for storing data under the control of the host 400, such as a mobile phone, a smart phone, an MP3 player, a laptop computer, a desktop computer, a game console, a TV, a tablet PC or an in-vehicle infotainment system. Alternatively, the storage device 50 may be a device for storing data under the control of the host 400 for storing high-capacity data in one place, such as a server or a data center. The storage device 50 may be manufactured as any of various types of storage devices according to a host interface that is a communication scheme with the host 400. Further, the storage device 50 may be manufactured as any of various package types.

The memory device 100 may store data. The memory device 100 may operate under the control of the memory controller 200. The memory device 100 may include a memory cell array including a plurality of memory cells for storing data.

Each of the memory cells may be configured as any of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array may include a plurality of memory blocks. Each memory block may include a plurality of memory cells. Each memory block may include a plurality of pages. In an embodiment, the page may be a unit for writing (programming) data in the memory device 100 or reading data stored in the memory device 100. The memory block may be a unit for erasing data.

In an embodiment, the memory device 100 may be, for example, a volatile memory device or a nonvolatile memory device. In this disclosure, for convenience of description, a case where the memory device 100 is a NAND flash memory is described.

The memory device 100 may receive a command and an address from the memory controller 200, and access an area selected by the address in the memory cell array. The memory device 100 may perform an operation instructed by the command on the area selected by the address. For example, the memory device 100 may perform a write operation (program operation), a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control operations of the storage device 50.

When power is applied to the storage device 50, the memory controller 200 may execute firmware (FW). When the memory device 100 is a flash memory device, the memory controller 200 may execute FW such as a flash translation layer (FTL) for controlling communication between the host 400 and the memory device 100.

In an embodiment, the memory controller 200 may receive data and a Logical Address (LA) from the host 400, and translate the LA into a Physical Address (PA) representing addresses of memory cells included in the memory device 100, at which the data is to be stored.

The memory controller 200 may control the memory device 100 to perform a program operation, a read operation, an erase operation, or the like according to a request from the host 400. In the program operation, the memory controller 200 may provide a program command, a PA, and data to the memory device 100. In the read operation, the memory controller 200 may provide a read command and a PA to the memory device 100. In the erase operation, the memory controller 200 may provide an erase command and a PA to the memory device 100.

In an embodiment, the memory controller 200 may autonomously generate a command, an address, and data regardless of a request from the host 400, and transmit the command, the address, and the data to the memory device 100. For example, the memory controller 200 may provide the memory device 100 with a command, an address, and data, which are used to perform read and program operations accompanied in performing wear leveling, read reclaim, garbage collection, or the like.

In an embodiment, the memory controller 200 may control at least two memory devices according to an interleaving scheme to improve operational performance. The interleaving scheme may be a scheme for controlling operations on at least two memory devices to overlap with each other. Further, the interleaving scheme may be a scheme for controlling operations of a plurality of groups divided in one memory device to overlap with each other. The group may be at least one memory die unit or at least one memory plane unit.

Further, the memory controller 200 may receive, from the host 400, a diagnostic command for requesting the memory controller 200 to perform a self-test operation, and perform the self-test operation in response to the diagnostic command. In one embodiment, the memory controller 200 may perform a self-test operation on the memory device 100 or the memory controller 200 itself. In another embodiment, the memory controller 200 may perform a self-test operation on the entire storage device 50.

The host 400 may communicate with the storage device 50, using at least one of various interface protocols or standards, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

In this disclosure, for convenience of description, a case where the storage device 50 and the host 400 perform data communication according to a UFS interface is described, but embodiments of the present disclosure are not limited to that the data communication is performed according to the UFS interface. Specifically, the storage device 50 and the host 400 may perform data communication, using a command defined as a Protocol Information Unit (hereinafter, referred to as a PIU). The PIU may be a type of data packet generated according to a predetermined protocol. Therefore, in this disclosure, the PIU is only a form of the command transmitted/received between the storage device 50 and the host 400, and hence the command and the PIU may substantially have the same meaning.

The command may be used for the host 400 or the storage device 50 to request, instruct, or respond to performing any operation. In an embodiment, various commands may be defined according to use and purpose. For example, all of a command, response, data out, query request, data in, ready to transfer, and the like may be referred to as commands. In one embodiment, these commands may be transmitted in the form of the PIU described above. The smallest size of the PIU may be 32 bytes, and a maximum size of the PIU may be 65,600 bytes. The format of the PIU may have different sizes according to a type thereof.

In an embodiment, when a command is provided in a PIU form, a diagnostic command for requesting performance of a self-test operation may be provided in a command PIU form. Further, a response to the diagnostic command may be provided in a response PIU form.

The host 400 may generate commands related to a self-test operation which the storage device 50 is to perform, and provide the commands to the memory controller 200. Further, the host 400 may receive a response to a command from the memory controller 200.

For example, the commands related to the self-test operation may be a diagnostic command (SEND DIAGNOSTIC CMD) for requesting performing of the self-test operation, a diagnostic result receiving command (RECEIVE DIAGNOSTIC RESULT CMD) for requesting a result of the self-test operation, and the like.

Figure 2:
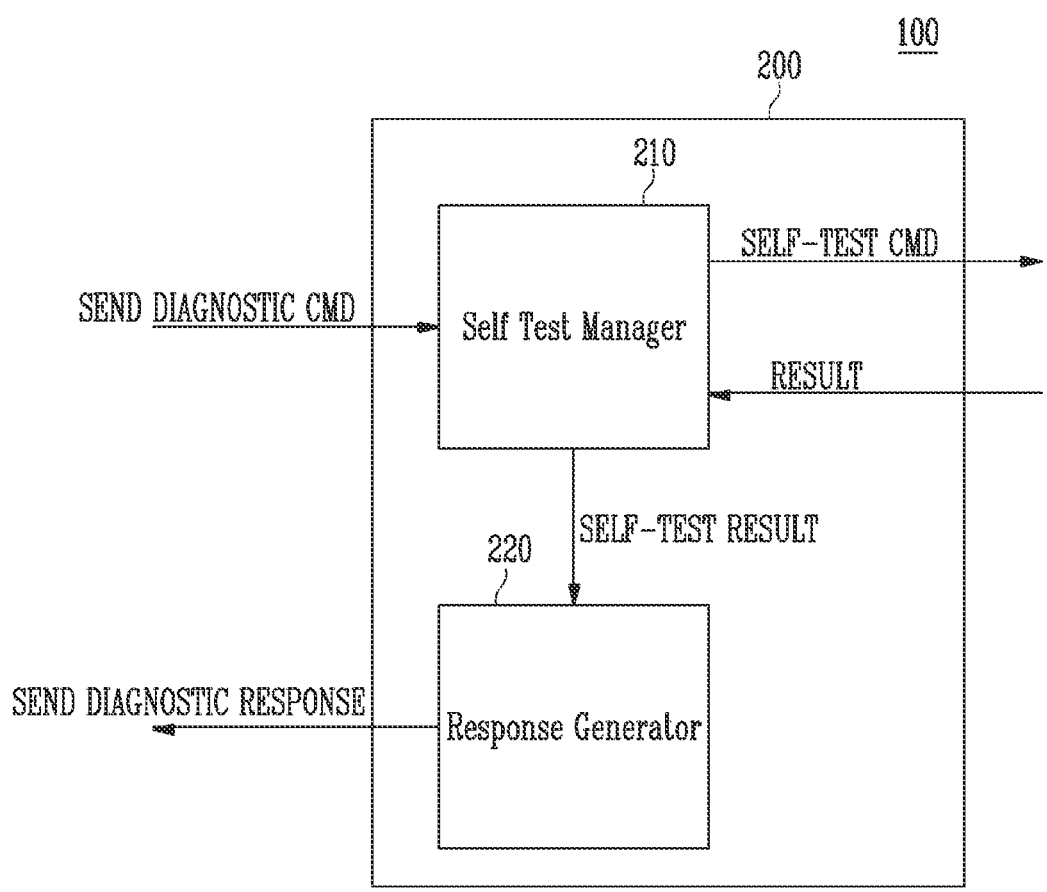
FIG. 2 is a diagram illustrating one example of a memory controller shown in FIG. 1.

FIG. 2 is a diagram illustrating one example of the memory controller shown in FIG. 1.

Referring to FIGS. 1 and 2, the memory controller 200 may include a self-test manager 210 and a response generator 220.

The self-test manager 210 may receive a diagnostic command SEND DIAGNOSTIC CMD for requesting performance of a self-test operation from the host 400. The diagnostic command SEND DIAGNOSTIC CMD may be provided in a PIU form. Information on the self-test operation which the storage device 50 is to perform may be included in the diagnostic command SEND DIAGNOSTIC CMD.

The self-test manager 210 may perform the self-test operation in response to the received diagnostic command SEND DIAGNOSTIC CMD. In one embodiment, the self-test manager 210 may perform the self-test operation on the memory controller 200 itself. In another embodiment, the self-test manager 210 may provide a self-test command SELF-TEST CMD to the memory device 100 to control the memory device 100 to perform the self-test operation. Accordingly, the self-test manager 210 may receive, from the memory device 100, a result obtained by performing the self-test operation. In still another embodiment, the self-test manager 210 may perform the self-test operation on the entire storage device 50.

The self-test manager 210 may provide a result of the self-test operation SELF-TEST RESULT to the response generator 220. The response generator 220 may generate a response including result information representing the result of the self-test operation. The response generated by the response generator 220 may be a response to the diagnostic command SEND DIAGNOSTIC RESPONSE. In an embodiment, the response generator 220 may generate a response in a PIU form. In an embodiment, the result information representing the result of the self-test operation may be included in an extra head segment of a response PIU. The result information representing the result of the self-test operation may include information on whether an error occurs in the self-test operation, a detailed reason why the error occurs, a position at which the error occurs, and the like.

The response generator 220 may provide the host 400 with the response to the diagnostic command SEND DIAGNOSTIC RESPONSE, and acquire a result of the self-test operation performed by the storage device 50, based on the result information included in the response. In an embodiment, the host 400 may check the extra header segment of the response to the diagnostic command SEND DIAGNOSTIC RESPONSE, thereby acquiring the result of the self-test operation.

Figure 3:
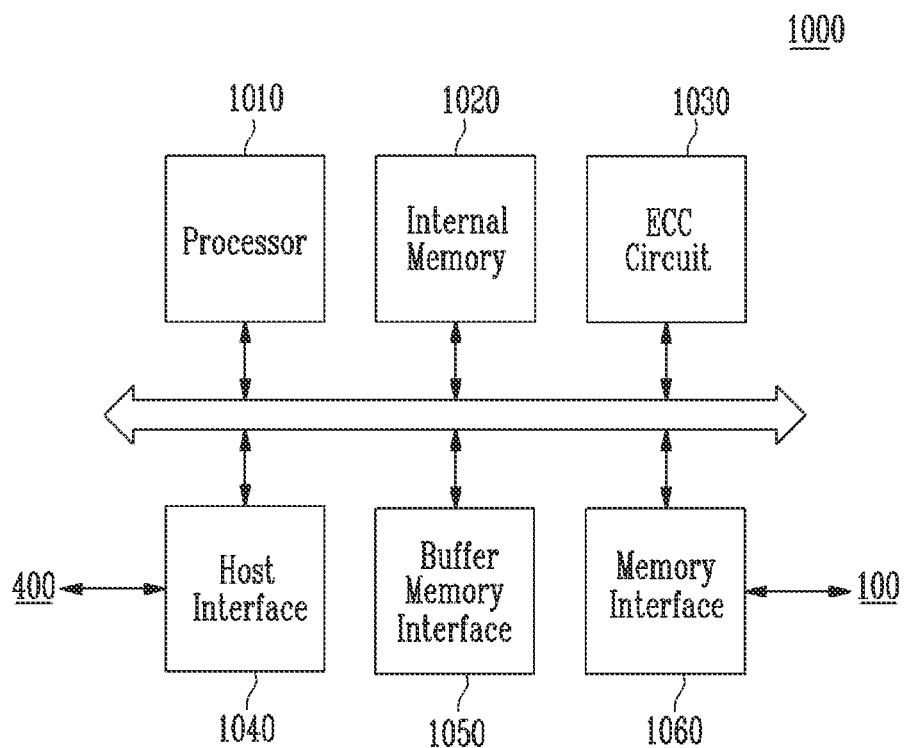
FIG. 3 is a diagram illustrating another example of the memory controller shown in FIG. 1.

FIG. 3 is a diagram illustrating another example of the memory controller shown in FIG. 1.

Referring to FIG. 3, a memory controller 1000 may include a processor 1010, an internal memory 1020, an error correction code (ECC) circuit 1030, a host interface 1040, a buffer memory interface 1050, and a memory interface 1060.

The processor 1010 may perform various calculations for controlling the memory device 100 and generate various commands. When the processor 1010 receives a request from the host 400, the processor 1010 may generate a command according to the received request, and transmit the generated command to a queue controller. In an embodiment, the processor 1010 may perform a self-test operation in response to a diagnostic command received from the host 400. In this disclosure, a request or a command, which the host 400 provides to the storage device 50, may mean that the request and the command are the same. The request or the command, which the host 400 provides to the storage device 50, may be distinguished from a command which the memory controller 200 provides to the memory device 100. Further, the processor 1010 may generate a response corresponding to the diagnostic command. The processor 1010 may generate the response corresponding to the diagnostic command such that a result of the self-test operation is included in the response. In an embodiment, the processor 1010 may generate a response in a PIU form, which includes a basic header segment and an extra header segment. In an embodiment, result information representing the result of the self-test operation may be included in the extra header segment.

The internal memory 1020 may store various information used for an operation of the memory controller 1000. For example, the internal memory 1020 may include logical and physical address map tables. The internal memory 1020 may be configured with at least one of a random access memory (RAM), a dynamic RAM (DRAM), a static RAM (SRAM), and a tightly coupled memory (TCM). In an embodiment, information related to the self-test operation may be stored in the internal memory 1020. However, the present disclosure is not limited thereto, and the information related to the self-test operation may be stored in a separate memory distinguished from the memory controller 1000.

The ECC circuit 1030 is configured to detect and correct an error of data received from the memory device 100 by using an error correction code (ECC). The processor 1010 may adjust a read voltage according to an error detection result of the ECC circuit 1030, and control the memory device 100 to perform re-reading. In an embodiment, an error correction block may be provided as a component of the memory controller 1000.

The host interface 1040 may transfer requests (or commands), addresses, data, and the like between the memory controller 1000 and the host 400. For example, the host interface 1040 may receive commands, addresses, data, and the like from the host 400, and transmit, to the host 400, data read from the memory device 100, a response to a command, and the like. The host interface 1040 may communicate with the host 400, using at least one of various interface protocols or standards, such as a Universal Serial bus (USB), a Serial AT Attachment (SATA), a Serial Attached SCSI (SAS), a High Speed InterChip (HSIC), a Small Computer System Interface (SCSI), a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), a Load Reduced DIMM (LRDIMM), an Enhanced Small Disk Interface (ESDI), and Integrated Drive Electronics IDE. In an embodiment, the host interface 1040 may receive a diagnostic command from the host 400, and transmit, to the host 400, a response to a diagnostic command generated by the processor 1010.

The buffer memory interface 1050 may transfer data between the processor 1010 and a buffer memory. The buffer memory may be used as a working memory or a cache memory of the memory controller 1000, and store data used in the storage device 50. The buffer memory may be used as a read buffer, a write buffer, a map buffer, or the like by the processor 1010. In some embodiments, the buffer memory may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR), or a Rambus Dynamic Access Memory (RDRAM). The buffer memory may be independently positioned outside the memory controller 1000. When the buffer memory is included in the memory controller 1000, the buffer memory interface 1050 may be omitted.

The memory interface 1060 may transfer commands, addresses, data, and the like between the memory controller 1000 and the memory device 100. For example, the memory interface 1060 may transmit commands, addresses, data, and the like to the memory device 100 through a channel, and receive data and the like from the memory device 100. In an embodiment, the memory interface 1060 may provide the memory device 100 with a self-test command for a self-test operation performed by the processor 1010. Further, the memory interface 1060 may receive, from the memory device 100, a result of a self-test operation performed by the memory device 100.

Figure 4:
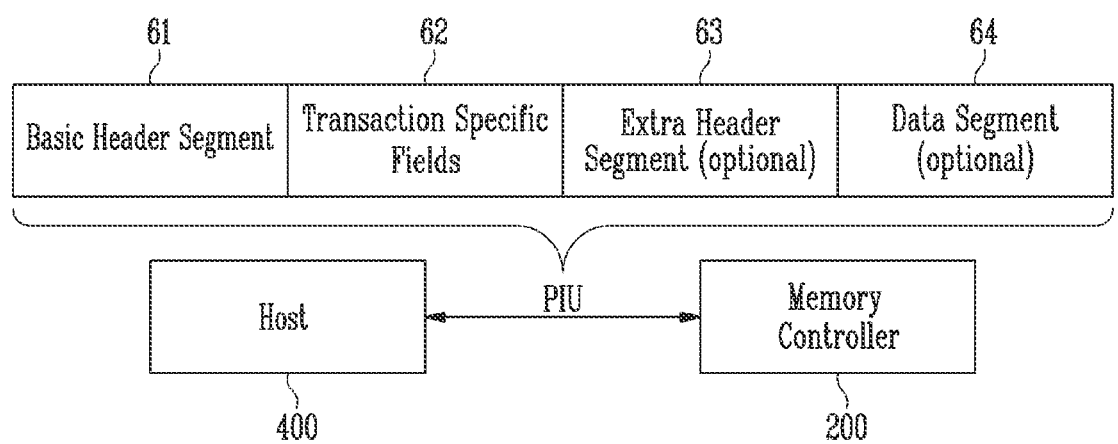
FIG. 4 is a diagram illustrating a structure of a data unit used for communication between a host and the memory controller.

FIG. 4 is a diagram illustrating a structure of a data unit (or packet) used for communication between the host 400 and the memory controller 200.

Referring to FIGS. 1 and 4, the host 400 and the memory controller 200 may communicate with each other, using data packets called Protocol Information Units (hereinafter, referred to as PIUs). In terms of interfacing between the host 400 and the storage device 50, a device may transmit a PIU to another device. A device generating a PIU may be referred to as an initiator device, and a device receiving the generated PIU may be referred to as a target device. That is, the PIU is not a data packet which one of the host 400 and the storage device 50 unilaterally transmit to the other device but may be a data packet transmitted between the two devices.

The PIU may include a query request PIU, a command PIU, a response PIU, a data out PIU, a data in PIU, and a ready to transfer PIU according to an operation which the host 400 or the memory controller 200 is to perform.

The query request PIU may provide the storage device 50 with a device descriptor including several parameters of the storage device 50.

The command PIU may be a protocol information unit transmitted when the host 400 transfers a command to the storage device 50.

The response PIU may be a protocol information unit transmitted when the storage device 50 provides a response to a command provided by the host 400.

The data out PIU may be a protocol information unit transmitted when the host 400 provides data to the storage device 50.

The data in PIU may be a protocol information unit transmitted when the storage device 50 provides data to the host 400.

The ready to transfer PIU may be a protocol information unit transmitted when the storage device 50 informs that the storage device has been ready to receive a data out PIU from the host 400. The ready to transfer PIU may be transmitted when the storage device 50 has a sufficient buffer space in which data provided by the host 400 is to be stored.

The smallest size of the PIU may be 32 bytes, and a maximum size of the PIU may be 65,600 bytes. The format of the PIU may have different sizes according to a type thereof.

In an embodiment, the PIU may include a basic header segment 61, a transaction specific field 62, an extra header segment 63, and a data segment 64.

The basic header segment 61 may have a size of 12 bytes. The basic header segment 61 may be commonly included in all PIUs. The basic header segment 61 may include basic setting information related to the PIU.

The transaction specific field 62 may be included in byte addresses 12 to 31 of the PIU. The transaction specific field 62 may include a dedicated transaction code according to the type of the PIU.

The extra header segment 63 may be defined when a total extra header segment length (Total EHS Length) field of the basic header segment 61 has a value which is not 0. The extra header segment 63 may start from a byte address 32 of the PIU. The extra header segment 63 may be an area capable of additionally storing data when sufficient information is not included in the basic header segment 61.

The data segment 64 may be included in the data out PIU or the data in PIU.

In an embodiment, the extra header segment 63 and the data segment 64 may not be included in all PIUs, but may be included only in a specific PIU.

FIG. 5 is a diagram illustrating a structure of the basic header segment of the PIU.

Referring to FIG. 5, the basic header segment 61 may include a transaction type, flags, a logical unit number (LUN), a task tag, an initiator ID, a command set type, a query function/task management function (Query Function, Task Manag. Function), a response, a status, a total extra header segment length (Total EHS Length), device information, and a data segment length.

The transaction type may be a field having a unique value according to the type of the PIU. An example of the transaction type according to the type of the PIU is as shown in the following Table 1.

TABLE 1

| When initiator device provides PIU to target device | Transaction type | When target device provides PIU to initiator device | Transaction type |
| --- | --- | --- | --- |
| Command PIU | 00 0001b | Response PIU | 10 0001b |
| Data out PIU | 00 0010b | Data in PIU | 10 0010b |
| X | X | Ready to transfer PIU | 11 0001b |

The flags may be fields having different values according to the transaction type. The logical unit number (LUN) may be a field indicating a number of a logical unit on which an operation is to be performed among a plurality of logical units included in an object on which the operation is to be performed. For example, each of the host 400 and the storage device 50, which are described with reference to FIG. 1, may include a plurality of logical units, and the logical unit number (LUN) of the basic header segment 61 included in the PIU may indicate a specific logical unit among the plurality of logical units.

The task tag may correspond to fields having different values according to the transaction type.

The initiator ID (IID) may be a field identifying who is an initiator requesting an operation. Therefore, the initiator ID may have different values when the host 400 generates the PIU and when the storage device 50 generates the PIU.

The command set type may be a field included in the command PIU and the response PIU. The command set type may be a field indicating which interface supports a command, such as whether the command is an SCSI command, a UFS command, or a command defined by a manufacturer.

The query function/task management function (Query Function, Task Manag. Function) may be a field input to the PIU such as a query request, a query response, or a task management request.

The response may be a field indicating whether performance of a requested operation has succeeded or failed.

The status may be a field indicating an SCSI status.

The total extra header segment length (Total EHS Length) may be a field indicating a size of the extra header segment in a 32-bit unit. The total extra header segment length (Total EHS Length) may be used when the PIU includes the extra header segment. A length of the extra header segment may be a 4-byte unit. A maximum size of the extra header segment may be 1024 bytes. When the extra header segment is not used, the total extra header segment length (Total EHS Length) may have a value of 0.

The device information may include information used only when a specific function is performed.

The data segment length may be a field indicating a length of a data segment of the PIU. When the PIU does not include the data segment, the data segment length may be 0.

FIG. 6 is a diagram illustrating a structure of a command descriptor block (CDB) included in the transaction specific field 62 of the PIU.

Referring to FIGS. 4 and 6, the command descriptor block may be included in the transaction specific field 62 of the PIU. An area in the transaction specific field 62, in which the command descriptor block is included, may be designated as a CDB field. The CDB field may be an array of 16 bytes, in which the command descriptor block is included.

Although FIG. 6 illustrates a command descriptor block format of 6 bytes, the size of the command descriptor block may be different therefrom. For example, a command descriptor block of a maximum of 16 bytes may be used in the UFS interface.

In an example, the command descriptor block may include zeroth to fifth bytes, and each byte may include zeroth to seventh bits.

Zeroth to seventh bits of the zeroth byte of the command descriptor block may indicate an operation code. For example, operation codes of respective SCSI commands used in the UFS interface are as shown in the following Table 2.

TABLE 2

| Command | Operation Code |
| --- | --- |
| FORMAT UNIT | 04h |
| INQUIRY | 12h |
| MODE SELECT (10) | 55h |
| MODE SENSE (10) | 5Ah |
| PRE-FETCH (10) | 34h |
| PRE-FETCH (16) | 90h |
| READ (6) | 08h |
| READ (10) | 28h |
| READ (16) | 88h |
| READ BUFFER | 3Ch |
| READ CAPACITY (10) | 25h |
| READ CAPACITY (16) | 9Eh |
| REPORT LUNS | A0h |
| REQUEST SENSE | 03h |
| SECURITY PROTOCOL IN | A2h |
| SECURITY PROTOCOL OUT | B5h |
| SEND DIAGNOSTIC | 1Dh |
| START STOP UNIT | 1Bh |
| SYNCHRONIZE CACHE (10) | 35h |
| SYNCHRONIZE CACHE (16) | 91h |
| TEST UNIT READY | 00h |
| UNMAP | 42h |
| VERIFY (10) | 2Fh |
| WRITE (6) | 0Ah |
| WRITE (10) | 2Ah |
| WRITE (16) | 8Ah |
| WRITE BUFFER | 3Bh |

Zeroth to seventh bits of the first to fifth bytes of the command descriptor block may include miscellaneous CDB information. The miscellaneous CDB information may be defined by standards of respective commands. In an embodiment, information on operations to be performed by the respective commands may be included in the miscellaneous CDB information.

Zeroth to seventh bits of a sixth byte of the command descriptor block may be defined as a control byte, but the control byte may not be used in the UFS interface.

Figures 7, 8:
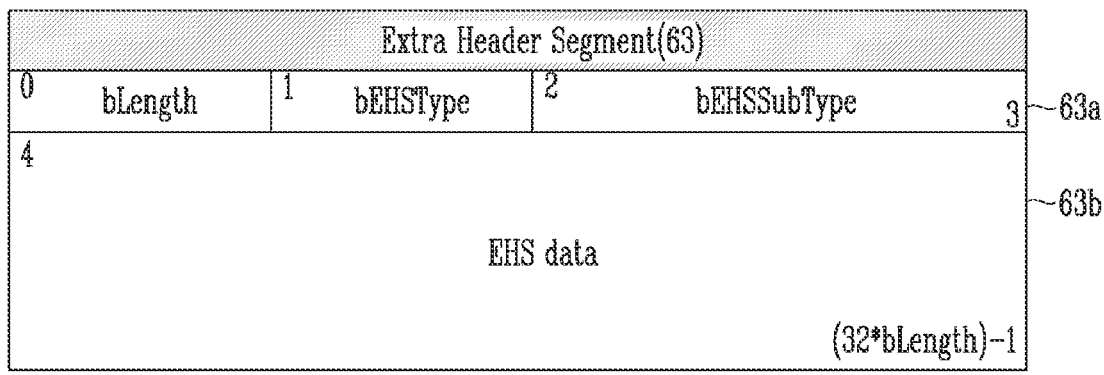
FIG. 7 is a diagram illustrating a structure of an extra header segment of the PIU.
FIG. 8 is a diagram illustrating a PIU structure of a diagnostic command in accordance with an embodiment of the present disclosure.

FIG. 7 is a diagram illustrating a structure of the extra header segment 63 of the PIU.

Referring to FIGS. 5 and 7, the extra header segment 63 may exist when the total extra header segment length (Total EHS Length) of the basic header segment 61 is not 0. That is, in the PIU, the extra header segment 63 may not exist, or at least one extra header segment 63 may exist. In an embodiment, the extra header segment 63 may start from the byte address 32 of the PIU. The length of the extra header segment 63 may be a multiple of 32 bytes. The extra header segment 63 may be an area capable of additionally storing data when sufficient information is not included in the basic header segment 61.

In an embodiment, the extra header segment 63 may include a header area 63a and a data area 63b. The header area 63a may include an EHS length (bLength) indicating a size of the extra header segment 63. The EHS length (bLength) may express the size of the extra header segment 63 in a 32-byte unit.

The header area 63a may further include an EHS type (bEHSType) indicating a type of data included in the extra header segment 63. For example, when the EHS type (bEHSType) has a value of 01h, the data included in the extra header segment 63 may be data related to an advanced RPMB operation. The header area 63a may further include an EHS sub-type (bEHSSubType) indicating a sub-type of the data included in the extra header segment 63.

The data area 63b may include EHS data transferred using the extra header segment 63. A type of the EHS data may be determined by values of the EHS type (bEHSType) and the EHS sub-type (bEHSSubType).

FIG. 8 is a diagram illustrating a PIU structure of the diagnostic command in accordance with an embodiment of the present disclosure.

Referring to FIGS. 1 and 8, the diagnostic command (SEND DIAGNOSTIC CMD) may be provided from the host 400. A PIU of the diagnostic command (SEND DIAGNOSTIC CMD) may include a basic header segment 61 and a transaction specific field 62.

In an embodiment, since the diagnostic command (SEND DIAGNOSTIC CMD) is a type of command, the diagnostic command (SEND DIAGNOSTIC CMD) may be provided in a PIU form to the storage device 50 from the host 400. Accordingly, a transaction type included in the basic header segment 61 of the diagnostic command (SEND DIAGNOSTIC CMD) may be expressed as xx00 0001b as described above in Table 1.

In one embodiment, a total extra header segment length (Total EHS Length) included in the basic header segment 61 of the diagnostic command (SEND DIAGNOSTIC CMD) may have a value of 0. The PIU of the diagnostic command (SEND DIAGNOSTIC CMD) may not include any extra header segment. However, the present disclosure is not limited thereto. In another embodiment, the total extra header segment length (Total EHS Length) included in the basic header segment 61 of the diagnostic command (SEND DIAGNOSTIC CMD) may have a value which is not 0. The PIU of the diagnostic command (SEND DIAGNOSTIC CMD) may include an extra header segment, and information related to a self-test operation to be performed by the diagnostic command (SEND DIAGNOSTIC CMD) may be additionally included in the extra header segment.

In an embodiment, a data segment length included in the basic header segment 61 of the diagnostic command (SEND DIAGNOSTIC CMD) may have a value of 0. The PIU of the diagnostic command (SEND DIAGNOSTIC CMD) may not include any data segment, but the present disclosure is not limited thereto.

The transaction specific field 62 of the diagnostic command (SEND DIAGNOSTIC CMD) may include an expected data transfer length. The expected data transfer length may indicate a number of bytes to be transmitted, which is used to complete a command as indicated by a command descriptor block included in the PIU.

Further, the transaction specific field 62 of the diagnostic command (SEND DIAGNOSTIC CMD) may include a CDB field, and a command descriptor block related to the self-test operation to be performed by the diagnostic command (SEND DIAGNOSTIC CMD) may be included in the CDB field. The command descriptor block included in the transaction specific field 62 of the diagnostic command (SEND DIAGNOSTIC CMD) will be described in more detail below with reference to FIG. 9.

FIG. 9 is a diagram illustrating a structure of a command descriptor block included in the transaction specific field of the diagnostic command in accordance with an embodiment of the present disclosure.

Referring to FIG. 9, the diagnostic command descriptor block included in the transaction specific field of the diagnostic command may indicate an operation code indicated by a zeroth byte, and the operation code indicated by the diagnostic command descriptor block may be expressed as 1Dh as described above in Table 2.

Fifth to seventh bits of a first byte in the diagnostic command descriptor block may indicate a self-test code. The self-test code may indicate a type of self-test operation to be performed. For example, a self-test code of 001b may indicate a background short self-test operation, and accordingly, the storage device may perform a short self-test operation in a background mode.

A self-test code of 010b may indicate a background extended self-test operation, and accordingly, the storage device may perform an extended self-test operation in the background mode.

A self-test code of 100b may indicate to abort the background self-test, and accordingly, the storage device performing a self-test operation in the background mode may abort the self-test operation. When the storage device is performing a self-test operation in a foreground mode, the storage device may end a command in a CHECK CONDITION status in which a sense key is set to ILLEGAL REQUEST and an extra sense code is set to INVALID FIELD IN CDB. In this disclosure, that a command is ended in a specific status may mean that the storage device provides the host with a response corresponding to the command, and a status of the response indicates a specific status.

A self-test code of 101b may indicate a foreground short self-test operation, and accordingly, the storage device may perform a short self-test operation in the foreground mode.

A self-test code of 110b may indicate a foreground extended self-test operation, and accordingly, the storage device may perform an extended self-test operation in the foreground mode.

In an embodiment, the short self-test operation may refer to a self-test operation which includes one or more segments and is completed within two minutes. The extended self-test operation may refer to a self-test operation which includes one or more segments and is completed according to a time defined separately. Tests performed in segments may vary for each manufacturer. Examples of the segments may be an electrical segment, a seek/servo segment, a read/verify segment, and the like. In the case of the electrical segment, a logical unit may test its own electronic device, and perform, for example, a buffer RAM test, a read/write circuit test, a read/write head test, and the like. In the case of the seek/servo segment, the storage device may test a search ability and a servo ability. In the case of the read/verify segment, the storage device may perform a read scan on a portion or the whole of a media surface.

When the storage device performs a self-test operation in the foreground mode, the storage device may end, in the CHECK CONDITION status, all commands except an inquiry command, a report LUNS command, and a request sense command.

When the storage device performs a self-test operation in the background mode, the storage device may complete a command in a GOOD status, initialize next self-test results log parameters in a self-test results log pages, and then perform the self-test operation.

A fourth bit of the first byte in the diagnostic command descriptor block may indicate a page format (PF) bit. The page format (PF) bit may specify a format of a parameter list sent by the host through the diagnostic command.

A second bit of the first byte in the diagnostic command descriptor block may indicate a self-test (SELFTEST) bit. The self-test (SELFTEST) bit may indicate whether the self-test operation to be performed by the storage device is a default self-test operation. In an embodiment, when the self-test (SELFTEST) bit indicates 1, the storage device may perform the default self-test operation. While the storage device performs the default self-test operation, the storage device may end, in the CHECK CONDITION status, all commands except the inquiry command, the report LUNS command, and the request sense command. In the CHECK CONDITION status, the sense key may be set to NOT READY, and the extra sense code may be set to UNIT NOT READY and SELF-TEST IN PROGRESS. When any error is not sensed during the default self-test operation, the storage device may end the command in the GOOD status. When an error is sensed during the default self-test operation, the storage device may end the command in the CHECK CONDITION status set such that the sense key is set to HARDWARE ERROR and the extra sense code indicates a reason of the error.

A first bit of the first byte in the diagnostic command descriptor block may indicate a device offline (DEVOFFL) bit. When the device offline (DEVOFFL) bit set to 1, this may mean that the default self-test operation performed by the storage device has influence on the logical unit in the storage device. When the device offline (DEVOFFL) bit set to 9, this may mean that any effect due to diagnostic command processing does not occur even in any logic unit after the storage device completes the default self-test operation. When the self-test (SELFTEST) bit is set to 0, the device offline (DEVOFFL) bit may be neglected.

A zeroth bit of the first byte in the diagnostic command descriptor block may indicate a unit offline (UNITOFFL) bit. When the unit offline (UNITOFFL) bit is set to 1, this may mean that the default self-test operation has influence on a medium accessible by a user in the logical unit. When the unit offline (UNITOFFL) bit is set to 1, this may mean that any effect due to diagnostic command processing does not occur in the medium accessible by the user after the storage device completes the default self-test operation. When the self-test (SELFTEST) bit is set to 0, the unit offline (UNITOFFL) bit may be neglected.

At least a portion of third and fourth bytes in the diagnostic command descriptor block may indicate a parameter list length. The parameter list length may be a length of a parameter list to be transmitted to the storage device from the host, which is expressed in a byte unit. When the parameter list length is 0, this may mean no data to be transmitted exists.

FIG. 10 is a table illustrating a self-test operation according to information included in the transaction specific field of the diagnostic command in accordance with an embodiment of the present disclosure.

Referring to FIG. 10, a self-test operation performed according to a combination of values of a self-test code, a page format (PF) bit, a self-test (SELFTEST) bit, and a parameter list length may be determined.

In case 1, all of the self-test code, the PF bit, the self-test bit, and the parameter list length may be 0. In the case 1, the storage device may complete a command in the GOOD status.

In case 2, the self-test code, the PF bit, and the self-test bit may be 0, and the parameter list length may not be 0. In the case 2, the storage device may receive a parameter list from the host to perform the self-test operation. When the storage device receives a diagnostic result receiving command (RECEIVE DIAGNOSTIC RESULT CMD), the storage device may provide parameter data to the host. However, in the case of the UFS interface, the diagnostic result receiving command (RECEIVE DIAGNOSTIC RESULT CMD) is not separately defined, which is problematic.

In case 3, the self-test code, the PF bit, and the parameter list length may be 0, and the self-test length may be 1. In the case 3, the storage device may perform a default self-test operation. When the default self-test operation is normally performed, the storage device may end the command in the GOOD status. When a failure occurs in the default self-test operation, the storage device may end the command in the CHECK CONDITION status set such that the sense key is set to HARDWARE ERROR and the extra sense code indicates a reason of the error.

In case 4, the self-test code and the PF bit may be 0, the self-test bit may be 1, and the parameter list length may not be 0. In the case 4, the storage device may end the command in the CHECK CONDITION status in which a sense key is set to ILLEGAL REQUEST and an extra sense code is set to INVALID FIELD IN CDB.

In case 5, when the self-test code, the self-test bit, and the parameter list length may be 0, and the PF bit may be 1. In the case 5, when the storage device receives the diagnostic result receiving command (RECEIVE DIAGNOSTIC RESULT CMD), the storage device may provide a diagnostic page or parameter data to the host according to whether the PF bit is supported. However, in the case of the UFS interface, the diagnostic result receiving command (RECEIVE DIAGNOSTIC RESULT CMD) is not separately defined, which is problematic.

In case 6, the self-test code and the self-test bit may be 0, the PF bit may be 1, and the parameter list length may not be 0. In the case 6, the storage device may receive a parameter list from the host to perform the self-test operation. When the storage device receives the diagnostic result receiving command (RECEIVE DIAGNOSTIC RESULT CMD), the storage device may provide a diagnostic page or parameter data to the host according to whether the PF bit is supported. However, in the case of the UFS interface, the diagnostic result receiving command (RECEIVE DIAGNOSTIC RESULT CMD) is not separately defined, which is problematic.

In case 7, the self-test code may be 0, the PF bit and the self-test bit may be 1. In the case 7, the storage device may end the command in the CHECK CONDITION status in which a sense key is set to ILLEGAL REQUEST and an extra sense code is set to INVALID FIELD IN CDB.

In case 8, the self-test code may not be 0, and the PF bit, the self-test bit, and the parameter list length may be 0. In the case 8, the storage device may perform the self-test operation, based on the self-test code. That is, the storage device may perform a background short self-test operation when the self-test code is 001b, perform a background extended self-test operation when the self-test code is 010b, perform abort background self-test when the self-test code is 100b, perform a foreground short self-test operation when the self-test code is 101b, and perform a foreground extended self-test operation when the self-test code is 110b.

In case 9, the self-test code may not be 0, the PF bit and the self-test bit may be 0, and the parameter list length may not be 0. In addition, in case 10, the self-test code may not be 0, the PF bit may be 0, and the self-test bit may be 1. In the cases 9 and 10, the storage device may end the command in the CHECK CONDITION status in which a sense key is set to ILLEGAL REQUEST and an extra sense code is set to INVALID FIELD IN CDB.

In case 11, the self-test code may not be 0, the PF bit may be 1, the self-test bit may be 0, and the parameter list length may not be 0. In the case 11, like the case 8, the storage device may perform the self-test operation, based on the self-test code. In addition, when the storage device receives the diagnostic result receiving command (RECEIVE DIAGNOSTIC RESULT CMD), the storage device may provide a diagnostic page or parameter data to the host according to whether the PF bit is supported. However, in the case of the UFS interface, the diagnostic result receiving command (RECEIVE DIAGNOSTIC RESULT CMD) is not separately defined, which is problematic.

In case 12, the self-test code may not be 0, the PF bit may be 1, the self-test bit may be 0, and the parameter list length may not be 0. In case 13, the self-test code may not be 0, the PF bit may be 1, and the self-test bit may be 1. In the cases 12 and 13, the storage device may end the command in the CHECK CONDITION status in which a sense key is set to ILLEGAL REQUEST and an extra sense code is set to INVALID FIELD IN CDB.

FIG. 11 is a diagram illustrating a PIU structure of a response to the diagnostic command in accordance with an embodiment of the present disclosure.

Referring to FIGS. 1 and 11, the memory controller 200 sends a response to the diagnostic command to the host 400. The PIU of the response to the diagnostic command may include may include a basic header segment 61, a transaction specific field 62, and an extra header segment 63. The PIU of the response may selectively further include a data segment 64.

In an embodiment, the response to the diagnostic command (SEND DIAGNOSTIC CMD) may be provided in a PIU form to the host 400 from the storage device 50. Accordingly, a transaction type included in the basic header segment 61 of the PIU of the response may be expressed as xx00 0001b as described above in Table 1.

In an embodiment, a total extra header segment length (Total EHS Length) included in the basic header segment 61 of the PIU of the response may not have a value of 0. Accordingly, the PIU of the response may include an extra header segment.

In an embodiment, the basic header segment 61 of the PIU of the response may include a response field. The response field may indicate whether a requested operation is to succeed. For example, when the response field has a value of 00h, the response field may indicate target success. When the response field has a value of 00h, the response field may indicate target failure.

In an embodiment, the basic header segment 61 of the PIU of the response may include a status field. The status field may indicate a status of a command provided from the host 400.

A GOOD status in the status of the command may indicate that the storage device has completed the command without any error. A CHECK CONDITION status in the status of the command may indicate that the storage device has completed the command with an error or that another operation is requested to process a result. When the CHECK CONDITION status occurs, valid sense data about a lastly processed command may be returned as the response.

In one embodiment, a data segment length (Total EHS Length) included in the basic header segment 61 of the PIU of the response may not have a value of 0. Accordingly, the PIU of the response may include the data segment 640. In another embodiment, the data segment length (Total EHS Length) included in the basic header segment 61 of the PIU of the response may have the value of 0. Accordingly, the PIU of the response may not include the data segment 64.

In an embodiment, the data segment 64 may include bytes in which a sense data length and sense data are stored.

The sense data may include additional information on an error status. Therefore, when the command is successfully performed, it is unnecessary to provide the sense data to the host 400. Hence, the response of the PIU may not include the data segment 64, and accordingly, the data segment length may have the value of 0.

The sense data length may indicate a byte number of valid sense data. In an embodiment, when an SCSI command set is used, the sense data length may have a value of 18.

The sense data may be provided in a fixed format, and the sense data format may include a response code, a sense key, sense information, an additional sense length, an additional sense code (ASC), an additional sense code qualifier (ASCQ), and the like.

The sense key may provide general information indicating that the command has not succeeded according to occurrence of an error or an exceptional situation. Accordingly, the sense key may indicate a specific type of the error. The additional sense code (ASC) may provide more detailed information on the error. In addition, the additional sense code qualifier (ASCQ) may further sub-divide error information.

Error types according to a value of the sense key are shown in the following Table 3.

TABLE 3

| SENSE KEY Value | DESCRIPTION |
| --- | --- |
| 00h | NO SENSE |
| 01h | RECOVERED ERROR |
| 02h | NOT READY |
| 03h | MEDIUM ERROR |
| 04h | HARDWARE ERROR |
| 05h | ILLEGAL REQUEST |
| 06h | UNIT ATTENTION |
| 07h | DATA PROTECT |
| 08h | BLANK CHECK |
| 09h | VENDOR SPECIFIC |
| 0Ah | COPY ABORTED |
| 0Bh | ABORTED COMMAND |
| 0Ch | RESERVED |
| 0Dh | VOLUME OVERFLOW |
| 0Eh | MISCOMPARE |
| 0Fh | RESERVED |

When the value of the sense key is 04h, this may indicate HARDWARE ERROR meaning that the storage device has found an irrecoverable hardware error.

When the value of the sense key is 05h, this may indicate ILLEGAL REQUEST meaning that an illegal parameter value is included in a command descriptor block or an additional parameter.

In the existing UFS interface, the diagnostic result receiving command (RECEIVE DIAGNOSTIC RESULT CMD) is not defined. Therefore, when a self-test operation is performed according to the diagnostic command (SEND DIAGNOSTIC CMD), the storage device 50 may provide a result of the self-test operation, using only status information of a response and sense data.

When the self-test operation according to the diagnostic command is successfully performed, the storage device may end the command by providing a response including status information indicating the GOOD status. When the storage device 50 is not ready to receive the diagnostic command, the storage device 50 may provide the host 400 with a response including status information indicating a BUSY status.

When a failure occurs in the self-test operation according to the diagnostic command, the storage device 50 may include status information indicating CHECK CONDITION, and the sense key may provide the host 400 with a response including a value indicating ILLEGAL REQUEST, MEDIUM ERROR, HARDWARE ERROR, UNIT ATTENTION, or the like.

When an error is found by the self-test operation, a response in which the sense key is set to 04h indicating HARDWARE ERROR may be provided to the host 400 from the storage device 50. Accordingly, the host 400 acquires only information indicating that the error was found by the self-test operation, and it is difficult for the host 400 to acquire detailed information on the error, which is problematic.

The PIU of the response to the diagnostic command provided by the memory controller 200 in accordance with the embodiment of the present disclosure can solve this problem, using the extra header segment 63.

The PIU of the response may include result information indicating a result of the self-test operation. The result information indicating the result of the self-test operation may include information on whether an error occurs in the self-test operation, a detailed reason why the error occurs, a position at which the error occurs, and the like.

Accordingly, the memory controller 200 in accordance with an embodiment of the present disclosure can provide, in more detail, the result of the self-test operation to the host 400 without receiving any separate command in addition to the diagnostic command (SEND DIAGNOSTIC CMD) from the host 400.

Figure 12:
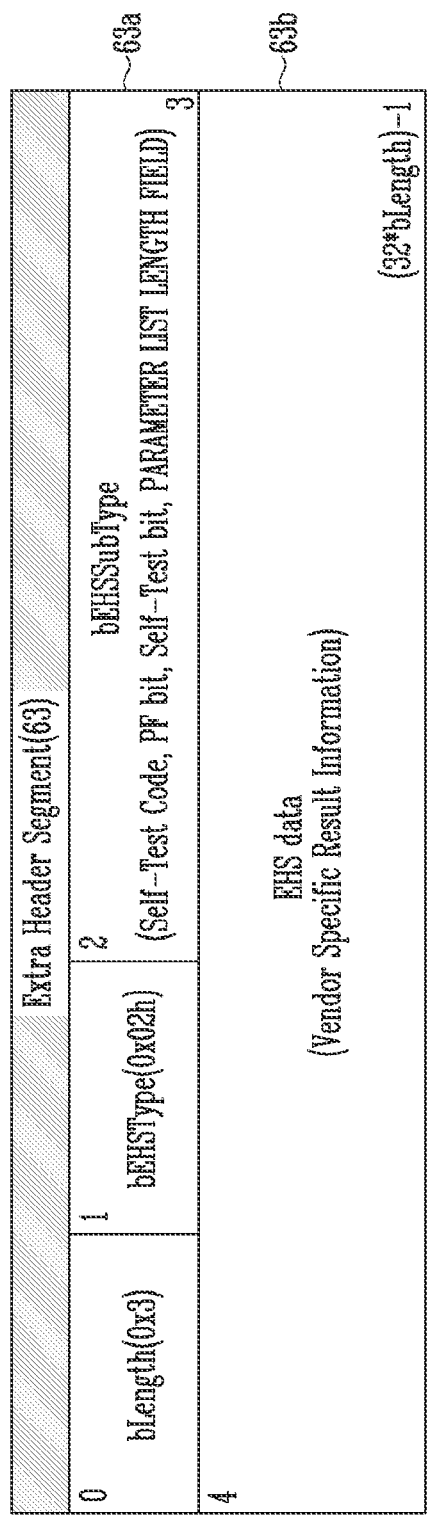
FIG. 12 is a diagram illustrating a structure of an extra header segment of the response in accordance with an embodiment of the present disclosure.

FIG. 12 is a diagram illustrating a structure of the extra header segment 63 of the response in accordance with an embodiment of the present disclosure.

Referring to FIG. 12, the extra header segment 63 may include a header area 63a and a data area 63b. The EHS length bLength included in the header area 63a may be expressed as 0x3. Accordingly, it can be seen that the extra header segment 63 has a size of 96 bytes. However, the size of the extra header segment 63 shown in FIG. 12 is merely illustrative, and may be smaller or greater than 96 bytes.

An EHS type bEHSType included in the header area 63a may be expressed as a value indicating that EHS data stored in the data area 63b is data related to a self-test operation. For example, the value indicating that the EHS data is the data related to the self-test operation may be defined as 02h.

An EHS sub-type bEHSSubType included in the header area 63a of the extra header segment 63 may be expressed as a value indicating a type of the self-test operation. For example, the EHS sub-type bEHSSubType may include at least one value selected from the group consisting of the self-test code, the page format (PF) bit, a self-test (SELFTEST) bit, and the parameter list length, which are described with reference to FIGS. 9 and 10. The EHS sub-type bEHSSubType may further include at least one value selected from the group consisting of the device offline (DEVOFFL) bit and the unit offline (UNITOFFL) bit. Information included in the EHS sub-type bEHSSubType may indicate a type of the self-test operation performed in the storage device 50 by combining information including the self-test (SELFTEST) code, the page format (PF) bit, the self-test (SELFTEST) bit, the parameter list length, and the like.

Result information indicating a result of the self-test operation may be included in the data area 63b of the extra header segment 63. The result information may be information defined for each manufacturer. For example, as described above, the result information may include information on whether an error occurs in the self-test operation, a detailed reason why the error occurs, a position at which the error occurs, and the like.

FIG. 13 is a sequence diagram illustrating an operating method of the storage device 50 in accordance with a comparative example of the present disclosure.

Referring to FIG. 13, in operation S1301, the host 400 may provide a diagnostic command (SEND DIAGNOSTIC CMD) to the storage device 50. Accordingly, the storage device 50 may perform a self-test operation. In operation S1303, the storage device 50 may provide the host 400 with a response (SEND DIAGNOSTIC Response) to the diagnostic command.

After that, in operation S1305, the host 400 may provide a diagnostic result receiving command (RECEIVE DIAGNOSTIC RESULT CMD) to the storage device 50 to acquire result information on the self-test operation. Accordingly, in operation S1307, the storage device 50 may provide the host 400 with the result information on the self-test operation through a data in (DATA IN) data packet.

When the result information is completely provided, in operation S1309, the storage device 50 may provide the host 400 with a response (RECEIVE DIAGNOSTIC RESULT Response) to the diagnostic result receiving command.

In an example, the command, the response, the data packet, and the like, which are described above, may be provided in a PIU form.

However, since the diagnostic result receiving command (RECEIVE DIAGNOSTIC RESULT CMD) is not defined in the UFS interface, the storage device 50 cannot provide the result information to the host 400, which is problematic. That is, the storage device 50 using the UFS interface cannot provide the result information through the data in (DATA IN) PIU as shown in FIG. 13, but may provide only limited information, using the response (SEND DIAGNOSTIC Response) to the diagnostic command.

FIG. 14 is a sequence diagram illustrating an operating method of the storage device 50 in accordance with an embodiment of the present disclosure.

Referring to FIG. 14, in operation S1401, the host 400 may provide a diagnostic command (SEND DIAGNOSTIC CMD) to the storage device 50. Accordingly, the storage device 50 may perform a self-test operation.

After that, in operation S1403, the storage device 50 may provide the host 400 with a response (SEND DIAGNOSTIC Response) to the diagnostic command. The response (SEND DIAGNOSTIC Response) to the diagnostic command may include an extra header segment. Result information on the self-test operation may be included in the extra header segment.

That is, the storage device 50 in accordance with the embodiment of the present disclosure may generate the response having the extra header segment in which the result information on the self-test operation is included. Accordingly, the storage device can provide the host 400 with more detailed result information on the self-test operation without receiving any separate diagnostic result receiving command (RECEIVE DIAGNOSTIC RESULT CMD).

In addition, as compared with the case shown in FIG. 13, where the storage device 50 provides the result information to the host 400, using the diagnostic result receiving command (RECEIVE DIAGNOSTIC RESULT CMD), a result information transmission flow is further simplified in the case shown in FIG. 14. Accordingly, a result information transmission operation speed can be increased, and a probability that an error will occur in result information transmission can be decreased.

Figure 15:
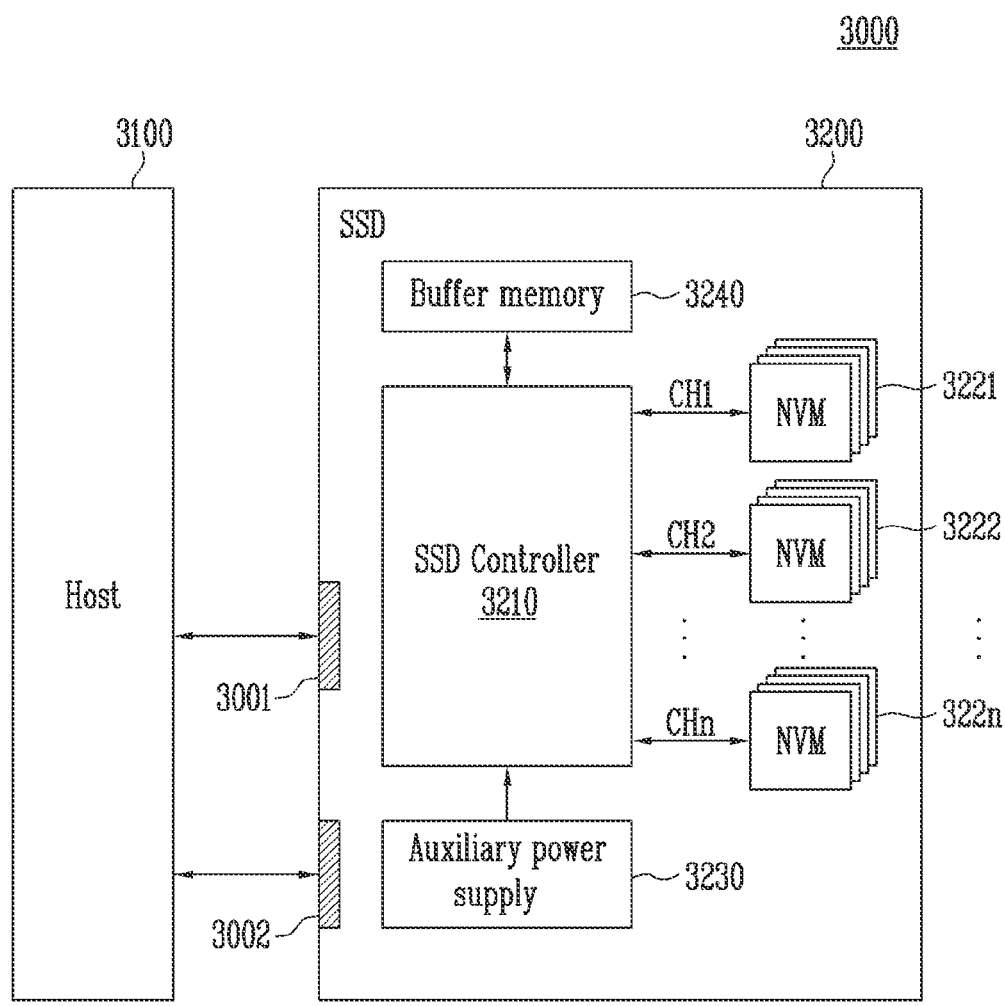
FIG. 15 is a block diagram illustrating a Solid State Drive (SSD) system to which the storage device is applied in accordance with an embodiment of the present disclosure.

FIG. 15 is a block diagram illustrating a Solid State Drive (SSD) system to which the storage device is applied in accordance with an embodiment of the present disclosure.

Referring to FIG. 15, the SSD system 3000 includes a host 3100 and an SSD 3200. The SSD 3200 may receive/transmit a signal from/to the host 3100 through a signal connector 3001, and receive power through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may serve as the memory controller 200 or 1000 described with reference to FIGS. 1 to 3.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of various interface protocols or standards such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

In an embodiment, the SSD controller 3210 may receive a diagnostic command (SEND DIAGNOSTIC CMD) from the host 3100, and perform a self-test operation on the SSD 3200 in response to the diagnostic command. Further, the SSD controller 3210 may generate a response (SEND DIAGNOSTIC Response) to the diagnostic command. The response to the diagnostic command may include an extra header segment, and result information for the self-test operation may be included in the extra header segment. The SSD controller 3210 may provide the generated response to the host 3100.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power to the SSD 3200. The auxiliary power supply 3230 may be located in the SSD 3200, or be located outside the SSD 3200. For example, the auxiliary power supply 3230 may be located on a main board, and provide auxiliary power to the SSD 3200.

The buffer memory 3240 may serve as a buffer memory of the SSD 3200. For example, the buffer memory 3240 may temporarily store data received from the host 3100 or data received from the plurality of flash memories 3221 to 322n, or temporarily store metadata (e.g., a mapping table) of the flash memories 3221 to 322n. The buffer memory 3240 may include at least one of volatile memories such as a DRAM, an SDRAM, a DDR SDRAM, an LPDDR SDRAM, and a GRAM, or may include at least one of nonvolatile memories such as an FRAM, an ReRAM, an STT-MRAM, and a PRAM.

In accordance with embodiments of the present disclosure, there can be provided a memory controller, a storage device, and an operating method of a storage device, which can more efficiently perform a self-test operation.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations and may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the scope of the present disclosure. It should be apparent to those skilled in the art that various modifications can be made on the basis of the technological scope of the present disclosure in addition to the embodiments disclosed herein. Furthermore, the embodiments may be combined to form additional embodiments.

What is claimed is:

1. A memory controller comprising:
 a host interface configured to receive, from a host, a diagnostic command for requesting performance of a self-test operation; and
 a processor configured to perform the self-test operation on a memory device, and generate a response corresponding to the diagnostic command,
 wherein the host interface is configured to transmit, to the host, the response including:
 a basic header segment included in protocol information units transmitted/received between the memory controller and the host; and
 an extra header segment including result information indicating a result of the self-test operation,
 wherein the protocol information units are a type of data packet generated according to a predefined protocol.

2. The memory controller of claim 1, wherein the basic header segment includes a total extra header segment length field indicating a length of the extra header segment.

3. The memory controller of claim 2, wherein the total extra header segment length field has a value which is different from 0.

4. The memory controller of claim 1, wherein the extra header segment includes:
 a header area including length information indicating a length of the extra header segment and type information indicating that the extra header segment includes information related to the self-test operation; and
a data area including the result information.

5. The memory controller of claim 4, wherein the header area further includes sub-type information indicating a type of the self-test operation.

6. The memory controller of claim 5, wherein the sub-type information includes at least one information selected from a group consisting of:
a self-test code indicating a kind of the self-test operation;
a page format bit indicating a format of a parameter list transmitted from the host;
a self-test bit indicating whether the self-test operation is a default self-test operation; and
a parameter list length indicating a length of the parameter list.

7. The memory controller of claim 1, wherein the diagnostic command includes:
a basic header segment; and
a transaction specific field including information on the self-test operation.

8. The memory controller of claim 7, wherein the transaction specific field includes a data packet including:
a self-test code indicating a type of the self-test operation;
a page format bit indicating a format of a parameter list transmitted from the host;
a self-test bit indicating whether the self-test operation is a default self-test operation; and
a parameter list length indicating a length of the parameter list.

9. A storage device comprising:
a memory device configured to store data; and
a memory controller configured to receive, from an external device, a diagnostic command for requesting performance of a self-test operation, perform the self-test operation in response to the diagnostic command, and provide the external device with a response corresponding to the diagnostic command,
wherein the response includes:
a basic header segment included in protocol information units transmitted/received between the external device and the memory controller; and
an extra header segment including result information indicating a result of the self-test operation,
wherein the protocol information units are a type of data packet generated according to a predefined protocol.

10. The storage device of claim 9, wherein the extra header segment includes:
a header area including length information indicating a length of the extra header segment and type information indicating that the extra header segment has been related to the self-test operation; and
a data area including the result information.

11. The storage device of claim 10, wherein the header area further includes sub-type information indicating a type of the self-test operation.

12. The storage device of claim 11, wherein the sub-type information includes at least one information selected from a group consisting of:
a self-test code indicating a type of the self-test operation;
a page format bit indicating a format of a parameter list transmitted from the external device;
a self-test bit indicating whether the self-test operation is a default self-test operation; and
a parameter list length indicating a length of the parameter list.

13. The storage device of claim 9, wherein the diagnostic command includes:
a basic header segment; and
a transaction specific field including information on the self-test operation.

14. The storage device of claim 13, wherein the transaction specific field includes a data packet including:
a self-test code indicating a type of the self-test operation;
a page format bit indicating a format of a parameter list transmitted from the external device;
a self-test bit indicating whether the self-test operation is a default self-test operation; and
a parameter list length indicating a length of the parameter list.

15. A method of operating a storage device, the method comprising:
receiving, from an external device, a diagnostic command for requesting performance of a self-test operation;
performing the self-test operation in response to the diagnostic command; and
generating a response including result information on the self-test operation,
wherein the response includes:
a basic header segment included in protocol information units transmitted/received between the storage device and the external device; and
an extra header segment including result information indicating a result of the self-test operation,
wherein the protocol information units are a type of data packet generated according to a predefined protocol.

16. The method of claim 15, wherein the extra header segment includes:
a header area including length information indicating a length of the extra header segment, type information indicating that the extra header segment has been related to the self-test operation, and sub-type information indicating a type of the self-test operation; and
a data area including the result information.

17. The method of claim 16, wherein the sub-type information includes at least one information selected from a group consisting of:
a self-test code indicating a type of the self-test operation;
a page format bit indicating a format of a parameter list transmitted from the external device;
a self-test bit indicating whether the self-test operation is a default self-test operation; and
a parameter list length indicating a length of the parameter list.

18. The method of claim 15, wherein the diagnostic command includes:
a basic header segment; and
a transaction specific field including information on the self-test operation.

19. The method of claim 18, wherein the transaction specific field includes a data packet including:
a self-test code indicating a type of the self-test operation;
a page format bit indicating a format of a parameter list transmitted from the external device;
a self-test bit indicating whether the self-test operation is a default self-test operation; and
a parameter list length indicating a length of the parameter list.

20. The method of claim 19, wherein, in the performing the self-test operation, an operation determined based on the data packet is performed.

* * * * *